United States Patent
Lee

(10) Patent No.: US 7,073,101 B2
(45) Date of Patent: Jul. 4, 2006

(54) METHOD OF TESTING MEMORY WITH CONTINUOUS, VARYING DATA

(75) Inventor: Chen-Tsai Lee, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 470 days.

(21) Appl. No.: 10/131,951

(22) Filed: Apr. 24, 2002

(65) Prior Publication Data

US 2003/0101392 A1    May 29, 2003

(30) Foreign Application Priority Data

Nov. 26, 2001  (TW) .............................. 90129153 A

(51) Int. Cl.
*G11C 29/00*    (2006.01)

(52) U.S. Cl. .................................................... 714/718

(58) Field of Classification Search ................ 714/718, 714/719, 720

See application file for complete search history.

(56) References Cited

U.S. PATENT DOCUMENTS

| | | | | | |
|---|---|---|---|---|---|
| 4,335,457 | A | * | 6/1982 | Early ........................ | 714/745 |
| 4,901,264 | A | * | 2/1990 | Hayashi ..................... | 708/250 |
| 6,345,372 | B1 | * | 2/2002 | Dieckmann et al. ........ | 714/720 |
| 6,647,521 | B1 | * | 11/2003 | Matsui ...................... | 714/719 |

* cited by examiner

*Primary Examiner*—Guy Lamarre
*Assistant Examiner*—James C. Kerveros
(74) *Attorney, Agent, or Firm*—Jianq Chyun IP Office

(57) ABSTRACT

A method of testing memory using continuous, varying data. More specifically, a method for testing whether a memory is weakened or damaged by continuously inputting and outputting varying data through the data I/O pins of the memory. At least a 75% data variation ratio on the test data is maintained to ensure high accuracy in detecting a weakened or damaged memory.

20 Claims, 13 Drawing Sheets

METHOD OF TESTING MEMORY WITH CONTINUOUS, VARYING DATA

BACKGROUND OF THE INVENTION

1. Field of the Invention

The present invention relates to a method of testing memory with continuous, varying data, wherein test data is continuously input and output through the input and output (I/O) pins of a memory to be tested. Such test data maintains at least a 75% data variation ratio to ensure high accuracy in screening out weakened memory components.

2. Description of Related Art

Memory is a key component in a computer as well as a key element affecting the operational stability of a computer system. As the capacity and speed of memory continue to increase, the manufacturing technology for memory chips has advanced to 0.2 microns or less; the operating voltage lowered to 3.3 volt or less; and the operating speed increased to over 133 MHz. Under such critical operating conditions, a memory chip could be easily weakened or damaged for reasons such as manufacturing errors, outside interference or internal noise. These factors will affect the stability of machine operation. For test engineers, how to sort out weakened memory in a relatively short time has become a challenging task.

With reference to FIGS. 8 and 9, a CMOS inverter is formed with a single-level inverter (11) and a single-level buffer (13). The inputs and outputs of the CMOS inverter are drain voltage (VDD), source voltage (VSS), input voltage (INPUT) and output voltage (OUTPUT). any noise on the drain voltage (VDD) or source voltage (VSS) can cause an error in the output from the inverter. These abnormal outputs could easily cause damage or weaken a memory chip.

Current methods of testing memory include using sophisticated test programs, in which the control pins, address pins and I/O pins of a tested memory chip are preset with a specific values, and complicated data I/O is passed through the tested memory. The test program is then able to determine whether a tested memory has been weakened.

Some of the commonly used memory testing methods are discussed below. With reference to FIG. 10, a conventional memory testing method for activating a single-bank memory sequentially output control signals such as bank active, memory read/write and precharge are to the memory together with a system clock pulse.

With reference to FIGS. 11 and 12, a control I/O operation may activate multiple memory banks. With reference to FIG. 11, the control I/O operation may activate two memory banks (Bank#0 and Bank#1). Furthermore, besides, With reference to FIG. 12, the control I/O operation for activating multiple memory banks can operate on the data I/O for an interleaved memory architecture. Theoretically speaking, when more memory banks are activated, as compared with the memory testing method described in FIG. 10, the accuracy should be higher in detecting weakened memory. However, the detection rate with this method was still rather low.

In order to overcome the drawbacks mentioned above, the present invention provides a method of testing memory with continuous, varying data.

SUMMARY OF THE INVENTION

The main objective of the present invention is to provide a method of testing memory using continuous, varying data, wherein varying test data is continuously input and output through the I/O pins of a tested memory. At least a 75% data variation ratio is maintained for such test data to ensure high accuracy in screening out weakened memory components.

Another objective of the present invention is to provide a method of testing memory using continuous, varying data, which can be generally applied on most DRAM memory, such as DDR-DRAM, RDRAM, SRAM, FCRAM and flash memory.

The features, characteristics and advantages of and methods used in the present invention will be more clearly understood when taken in connection with the accompanying figures.

DETAILED DESCRIPTION OF THE PREFERRED EMBODIMENT

The main objective of the present invention is to provide a method of testing memory using continuous, varying data, wherein varying test data is continuously input and output through the I/O pins of a tested memory. at least 75% data variation ratio is maintained on such test data to ensure high accuracy in screening out weakened memory components.

This memory test causes a high volume of data input and output to be put through the data I/O pins of the tested memory and causes the data status of internal memory cells to change at a high frequency. This process thus allows a weakened memory to be detected with high accuracy and in a relatively short time.

Figure 1:
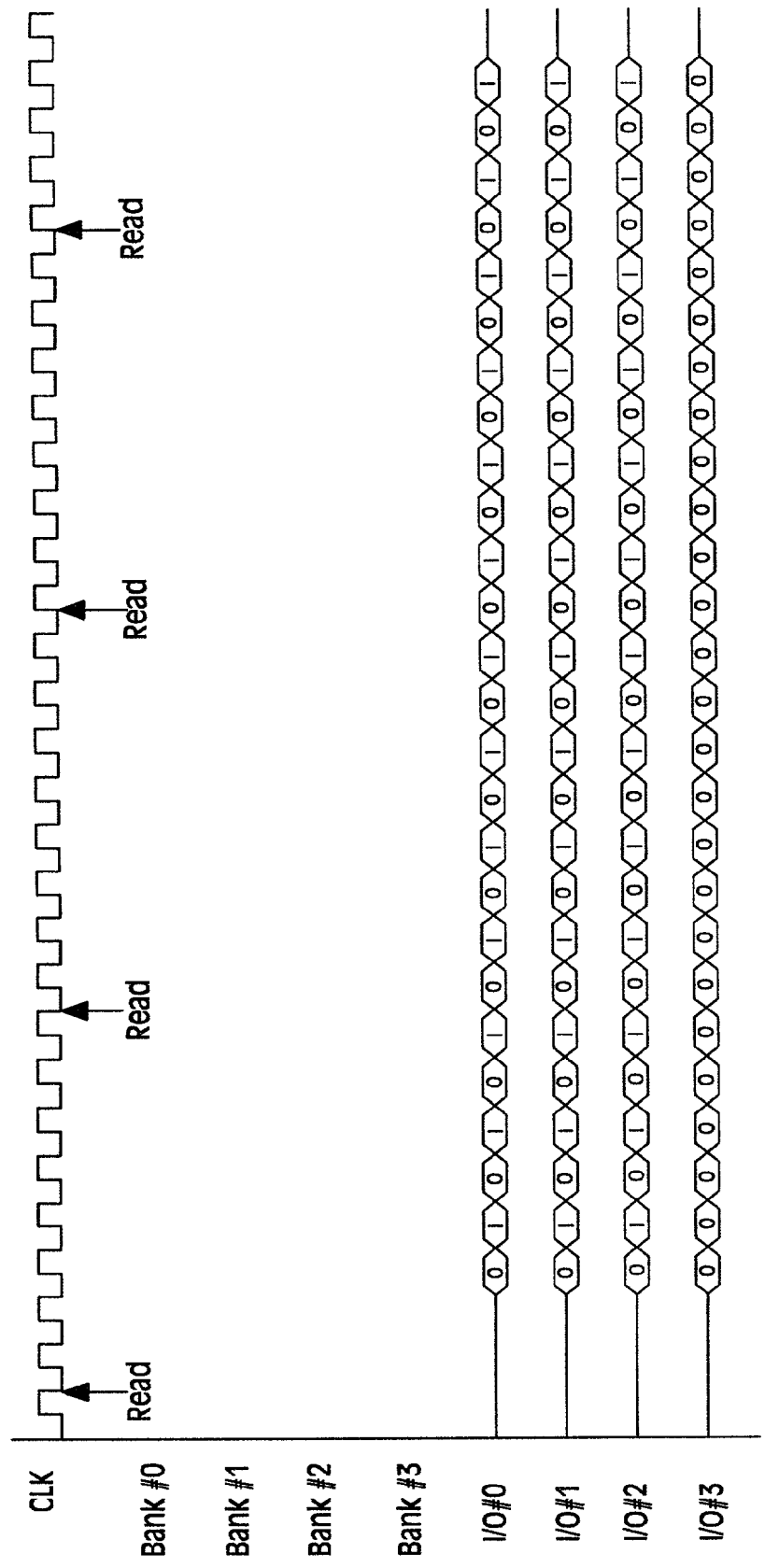
FIG. 1 is a clocked timing diagram of a first embodiment of a method of testing memory using continuous, varying data in accordance with the present invention.

With reference to FIG. 1 and for illustration purposes, a memory component has a single memory bank and four I/O pins (I/O#0~#3). The memory is activated for continuous memory I/O through I/O #0~2 with the same data string, disregarding the sequence of 0s and 1s in the data string, while 0s are maintained on I/O#3 throughout the memory test. Triggered by a clock pulse from a system clock, data on each I/O pin is continuously toggled, which is accomplished by controlling the electric potential level on the input of the data I/O pin. The data string shown in the diagram is in a binary format, where a "0" represents the low potential level and a "1" the high potential level. In the present embodiment, three out of the four data I/O pins are employed for the continuous memory I/O tests. The overall data variation ratio is 75%, in accordance with the requirements for the memory test. Using this method, the detection rate for weakened memory has improved considerably.

Figure 2:
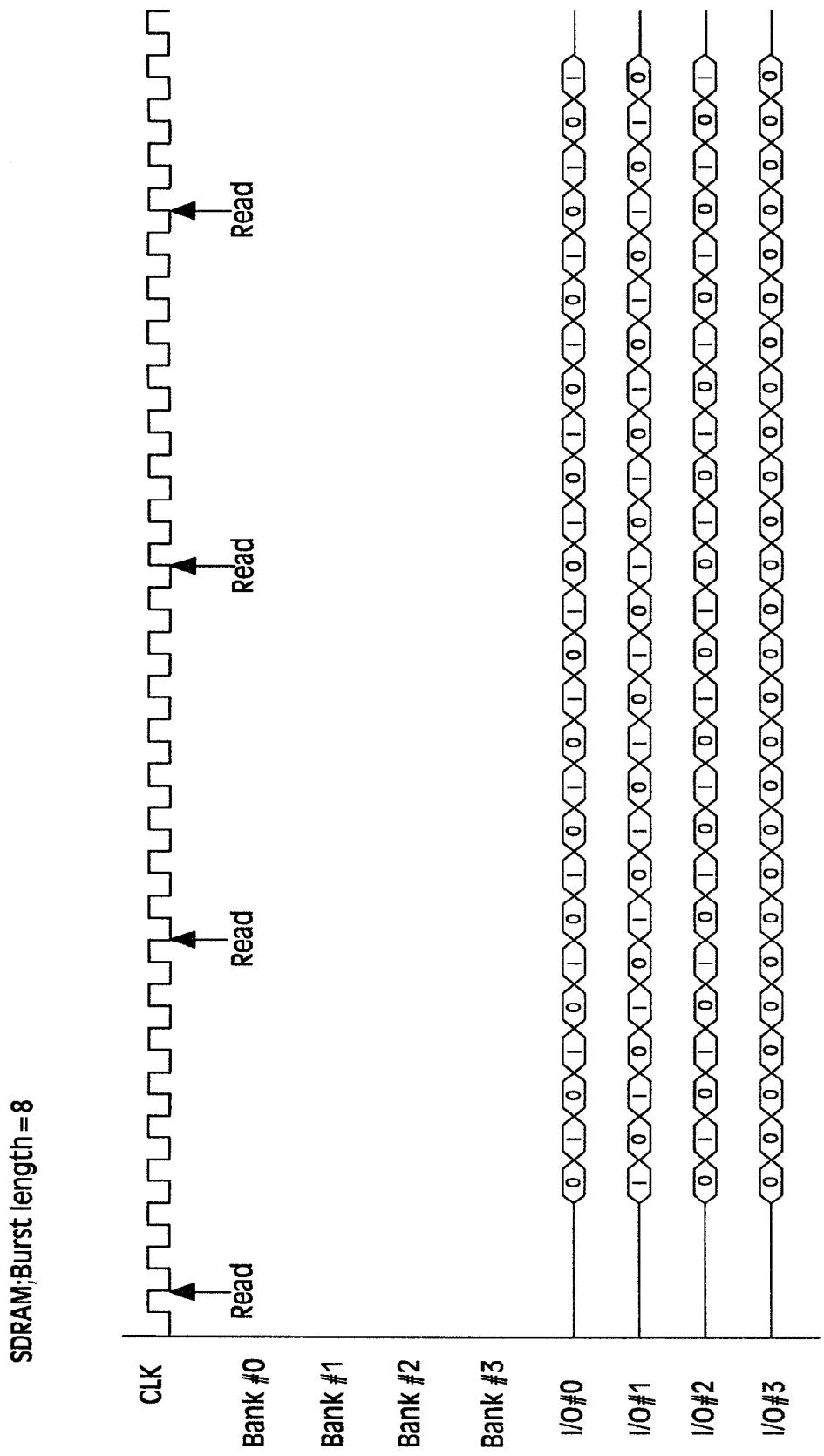
FIG. 2 is a clocked timing diagram of a second embodiment of the method of testing memory using continuous, varying data in accordance with the present invention.

With reference to FIG. 2, a second embodiment of the present invention is basically similar to the first embodiment. However, the status of the data I/O pins is different. Data input and output is conducted through I/O #0~#2, and I/O#3 remains unchanged. The data string on I/O #1 is just the complement of that on I/O#0 and I/O#2. When the data on I/O#1 is a 1, the corresponding data on I/O#0 and I/O#2 is a 0. Data change continuously on three out of four I/O pins; therefore the varying data used in this embodiment is in accordance with the 75% data variation ratio for the continuous memory I/O tests.

Figure 3:
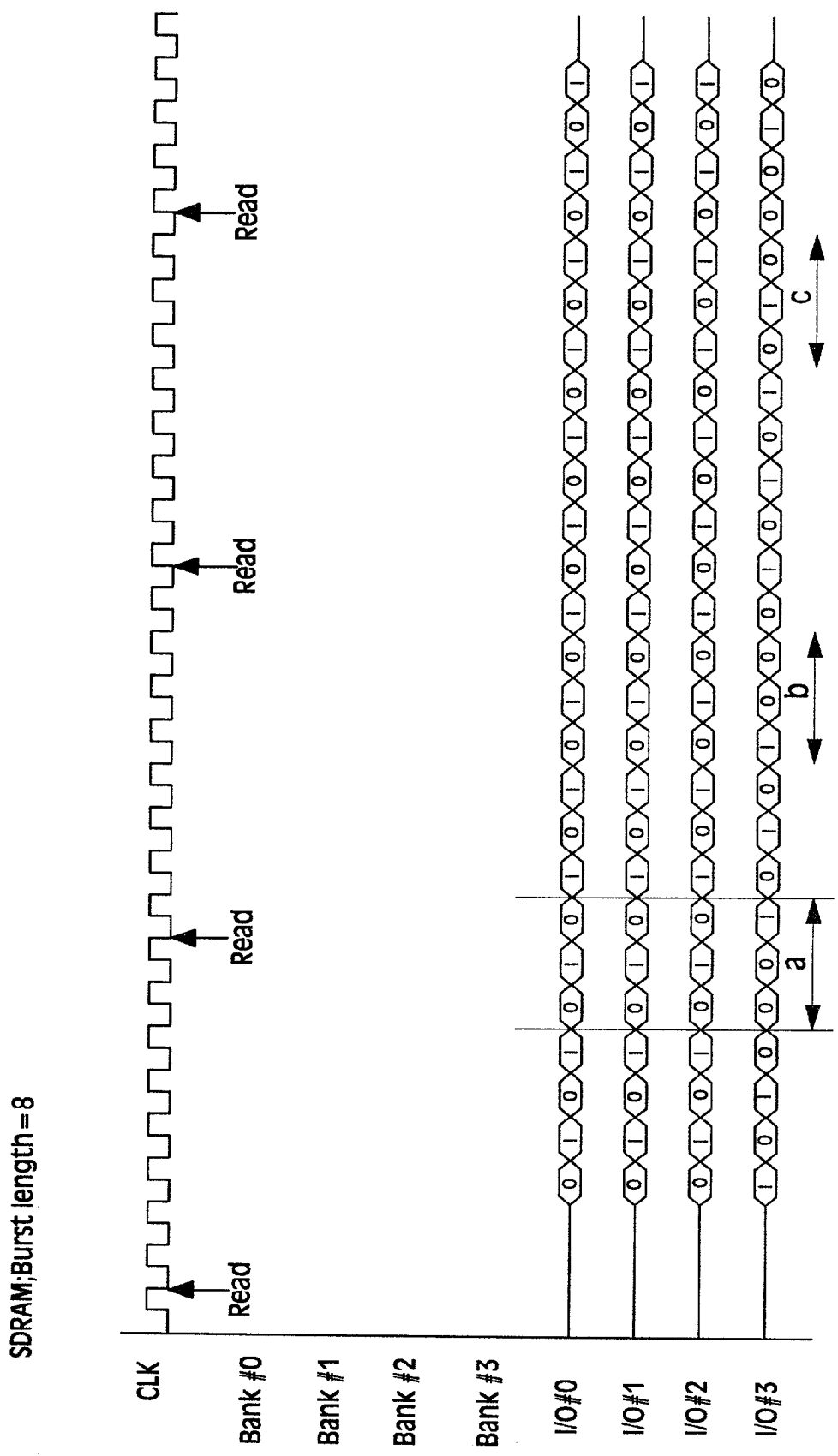
FIG. 3 is a clocked timing diagram of a third embodiment of the method of testing memory using continuous, varying data in accordance with the present invention.

With reference to FIG. 3, another embodiment of the present invention uses all the data pins (I/O#0~3) for memory I/O tests. Although no specific sequence is used for the data input, the data variation ratio for a block of memory has to be at least 75%. Taking block (a) as an example for our illustration, the data on I/O#0~3 initially change from 0100 to 1010, and then from 1010 to 0001. During the first stage data transformation, data on I/O#0~#2 are changed, while I/O#3 remains unchanged; but in the second stage data transformation, data on I/O#0, I/O#2~3 are changed while I/O#1 remains unchanged. Overall speaking, at any given transition, data changes take place on three out of four I/O pins; therefore the data variation ratio is still maintained at 75%. The same data change process also applies to Block (b) and (c).

Figure 4:
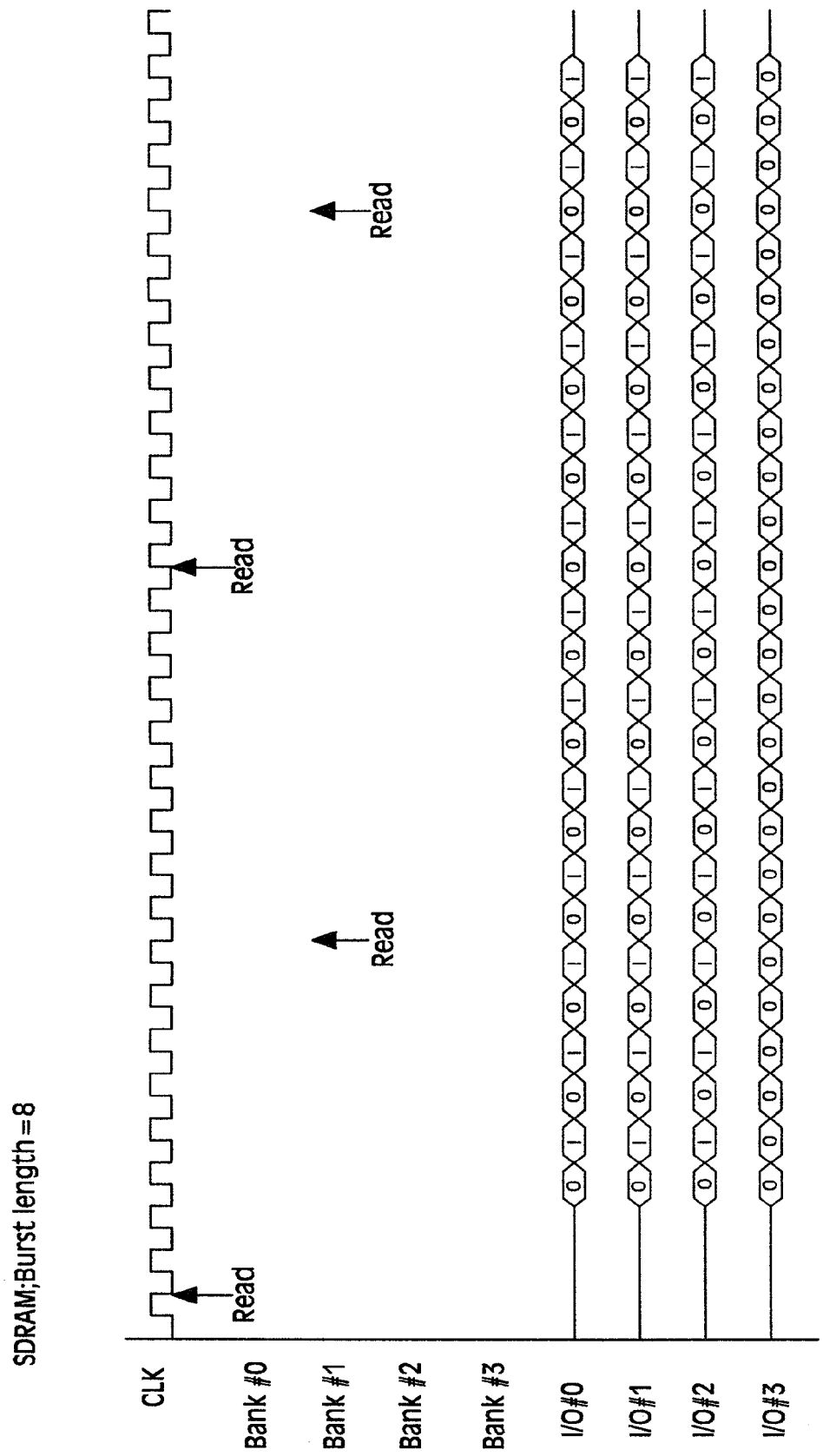
FIG. 4 is a clocked timing diagram of a fourth embodiment of the method of testing memory using continuous, varying data in accordance with the present invention.
Figure 5:
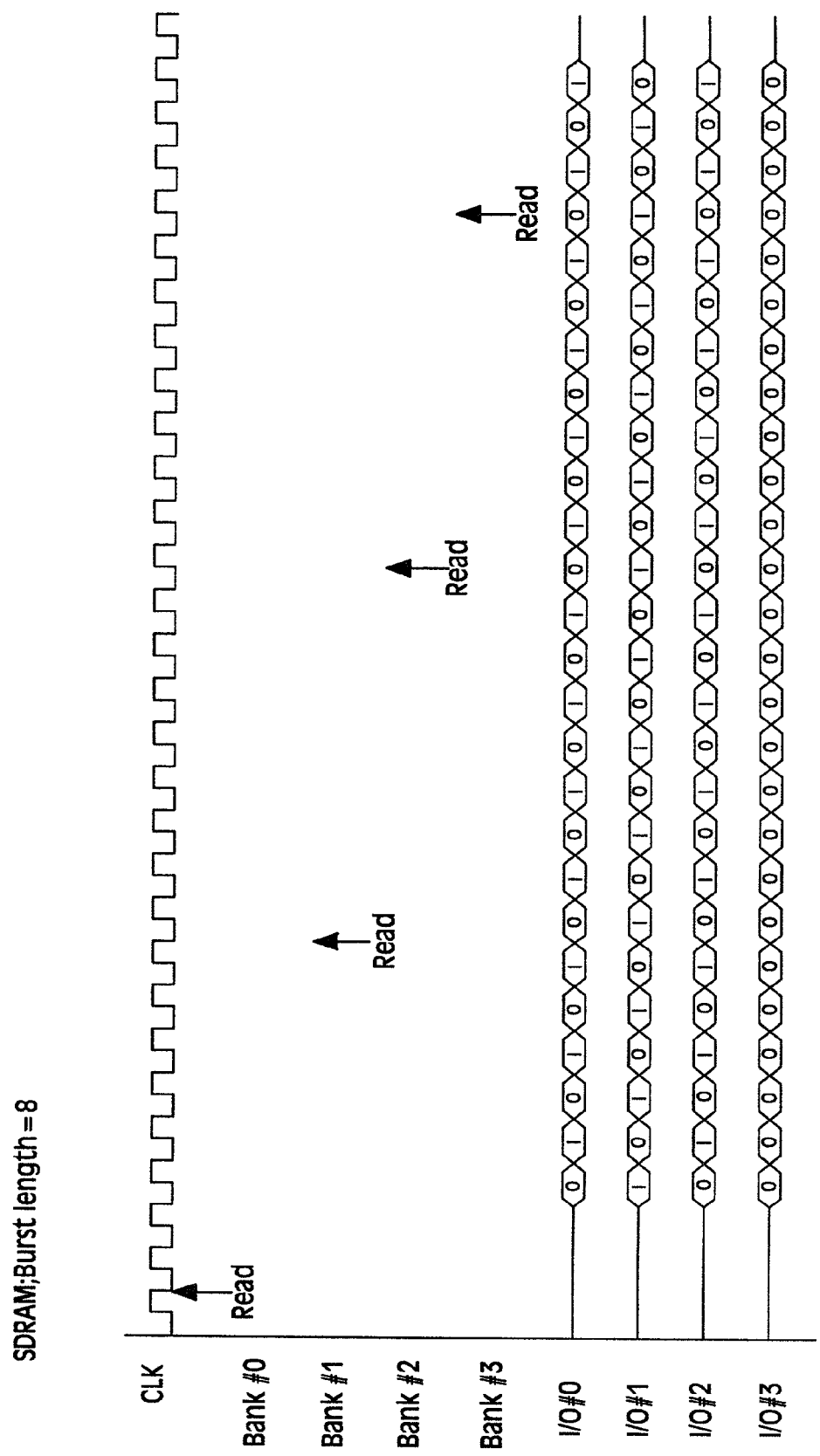
FIG. 5 is a clocked timing diagram of a fifth embodiment of the method of testing memory using continuous, varying data in accordance with the present invention.

The method proposed in the present invention is capable of activating multiple banks of memory for memory testing simultaneously. With reference to FIG. 4, a fourth embodiment of the present invention activates two memory banks (Bank#0 and Bank#1) for memory I/O tests. With reference to FIG. 5, a fifth embodiment activates all four memory banks (Bank#0~#3) for memory I/O tests.

Figure 6A:
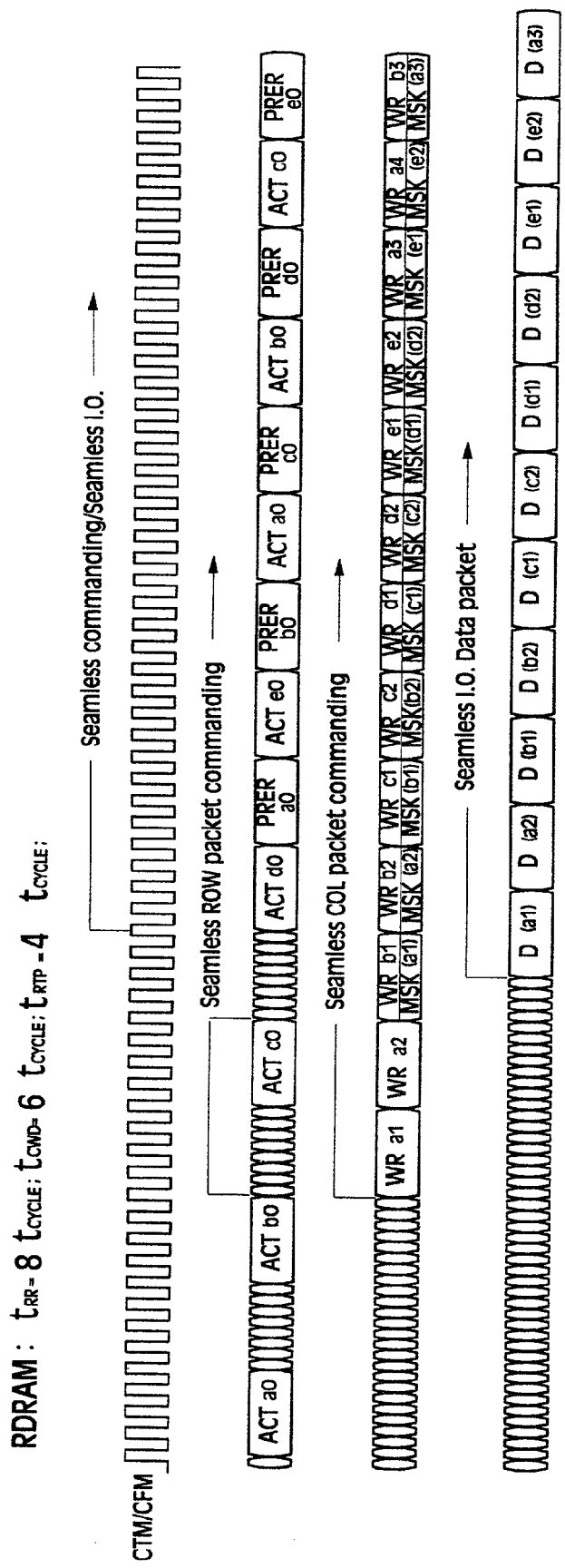
FIGS. 6 (A) & (B) are clocked timing diagram of a sixth embodiment of the method of testing memory using continuous, varying data in accordance with the present invention.
Figure 6B:
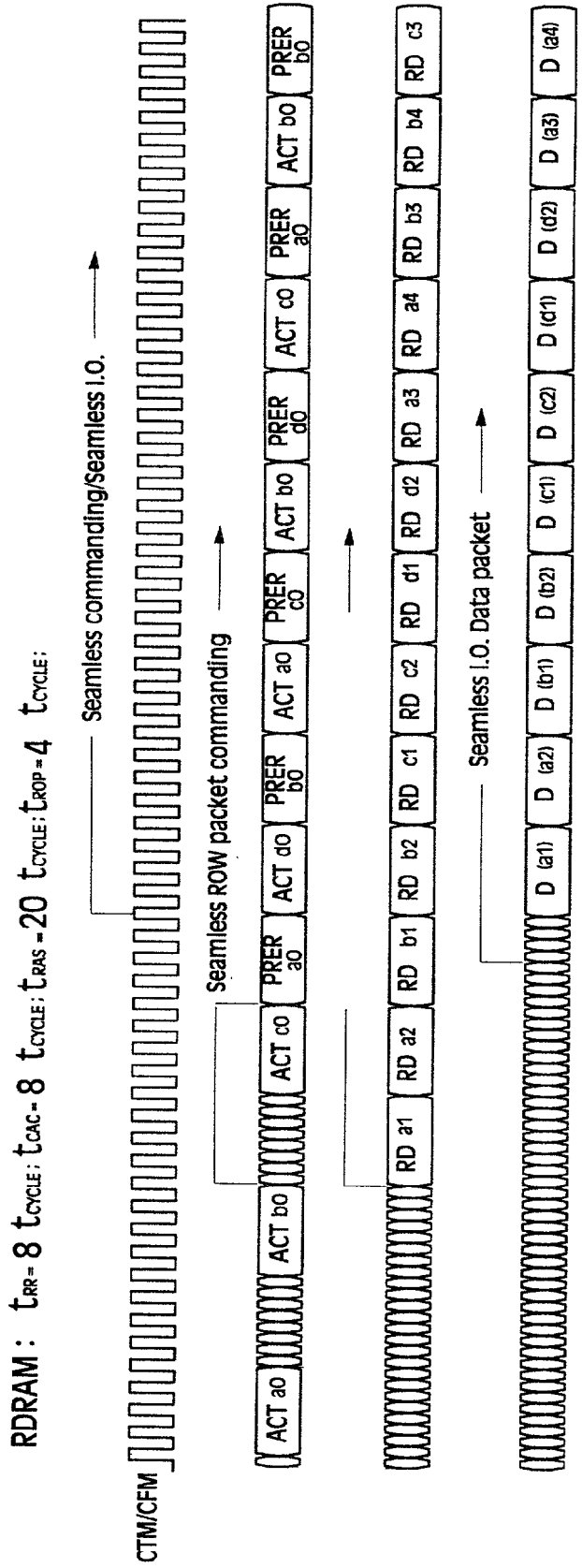

With reference to FIGS. 6 (A) & (B), The main difference between the memory test on RDRAM and the previous examples is that the data I/O is conducted in units called "packets". A packet represents a group of data treated as a unit in memory I/O operation. Data status in 75% of data packets is changed in the memory I/O tests, in accordance with the 75% data variation ratio.

Figure 7:
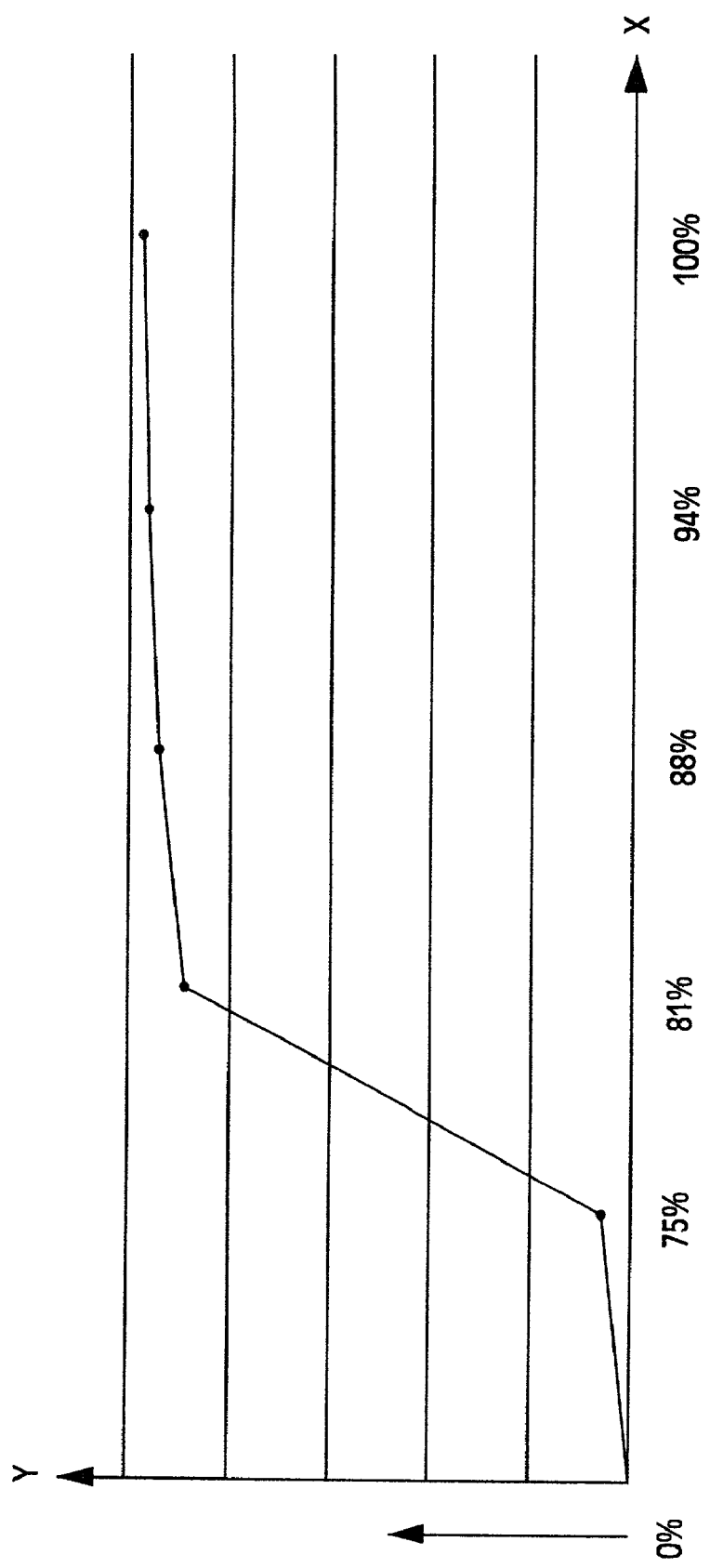
FIG. 7 is graph of the test results of the method of testing memory using continuous, varying data in accordance with the present invention.
Figure 8:
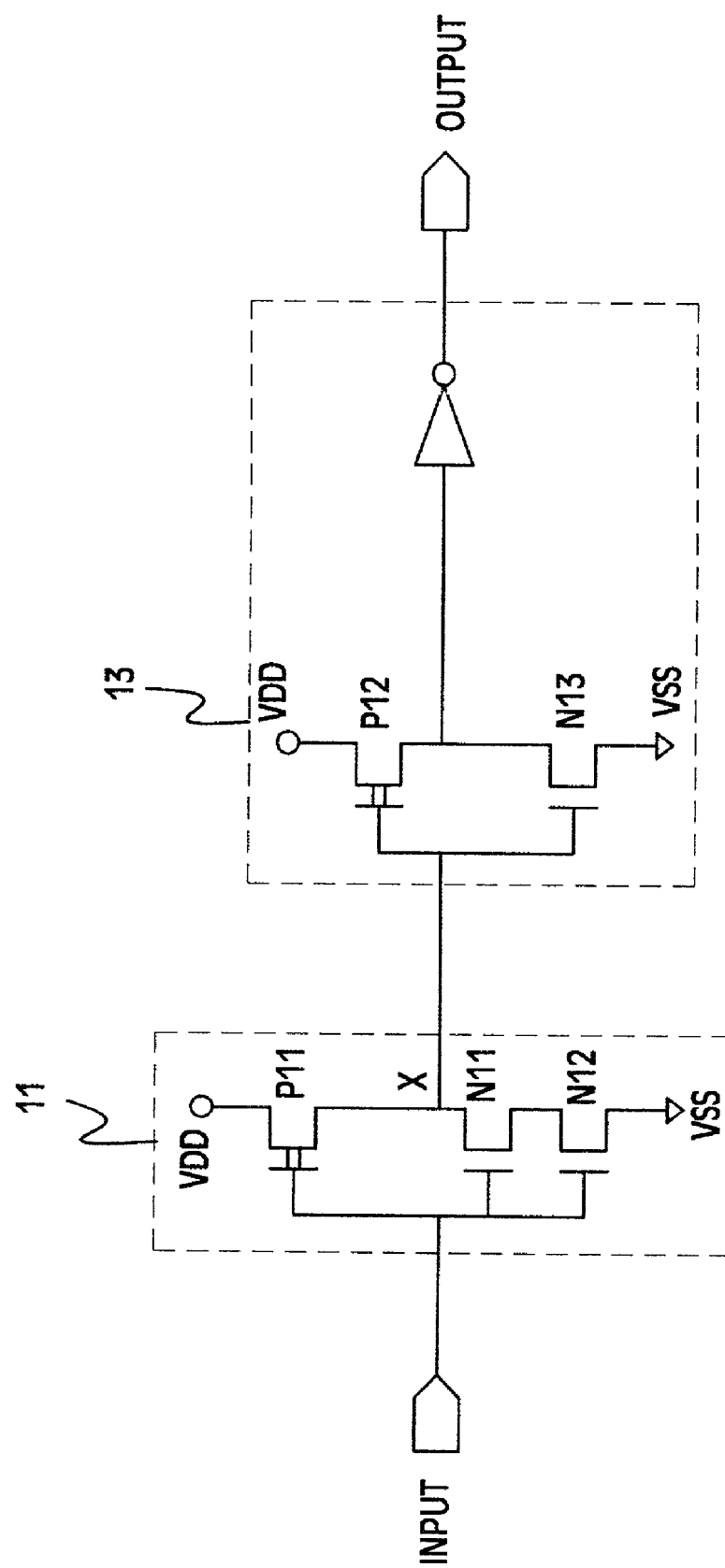
FIG. 8 is a circuit diagram of a CMOS inverter.
Figure 9:
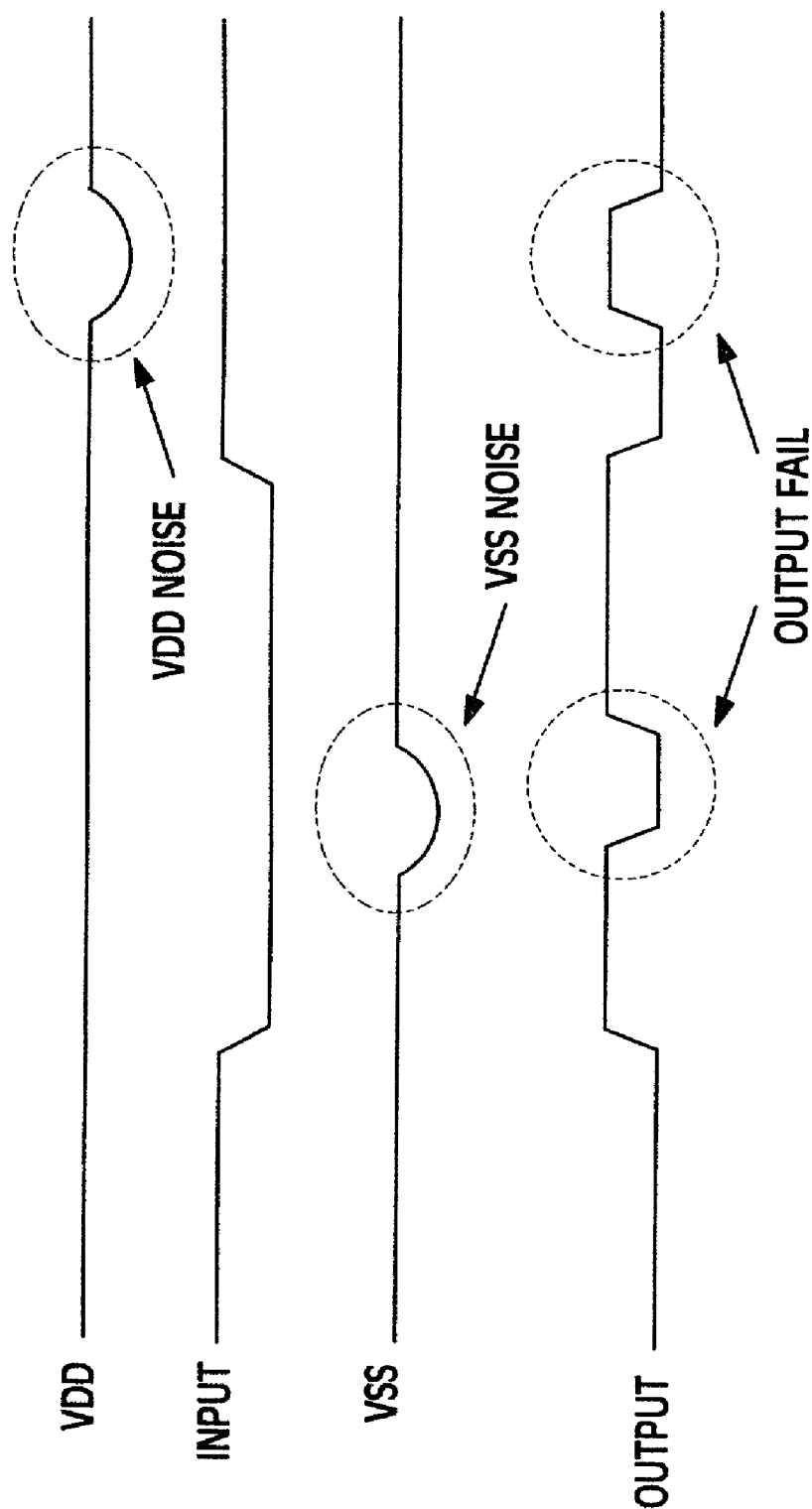
FIG. 9 is a waveform diagram of the input and output from the CMOS in FIG. 8.
Figure 10:
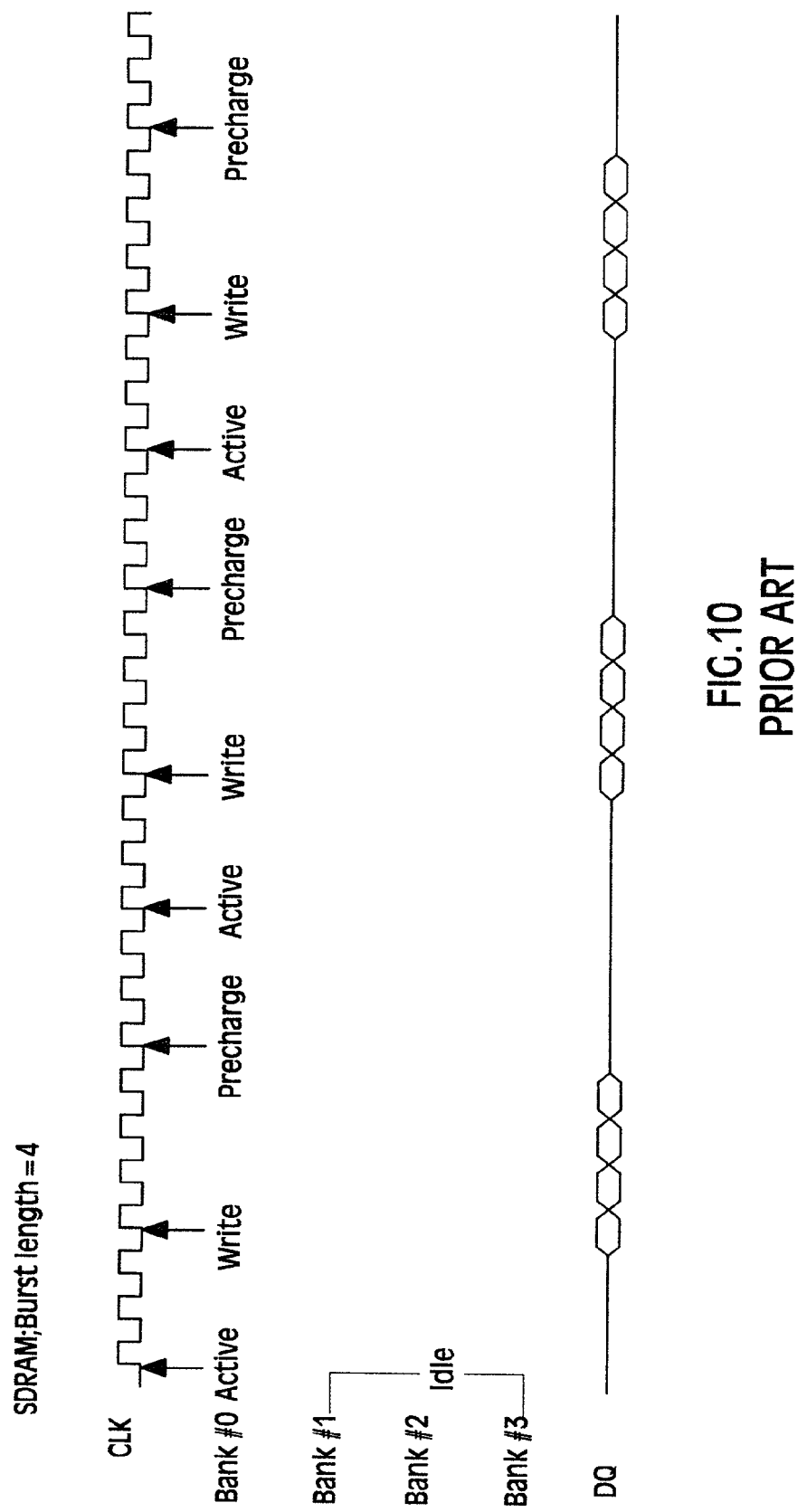
FIG. 10 is a clocked timing diagram using a conventional memory testing method.
Figure 11:
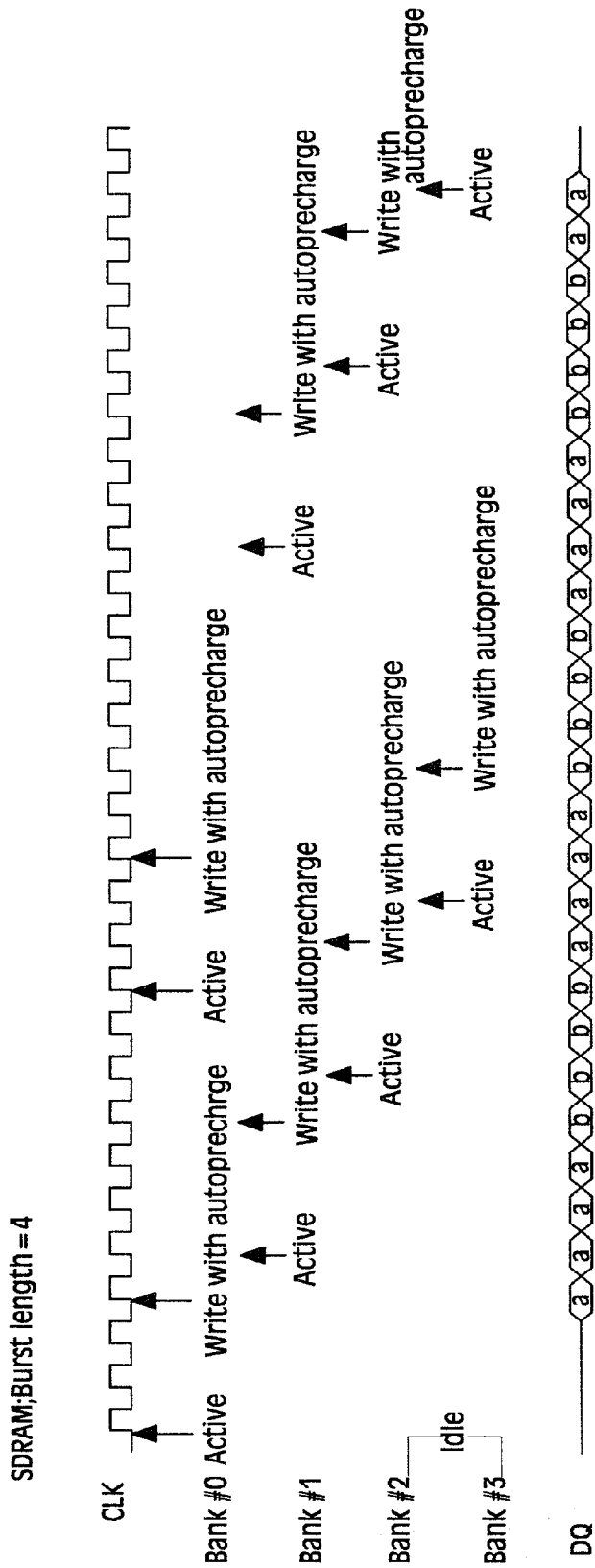
FIG. 11 is clocked timing diagram using another conventional memory testing method.
Figure 12:
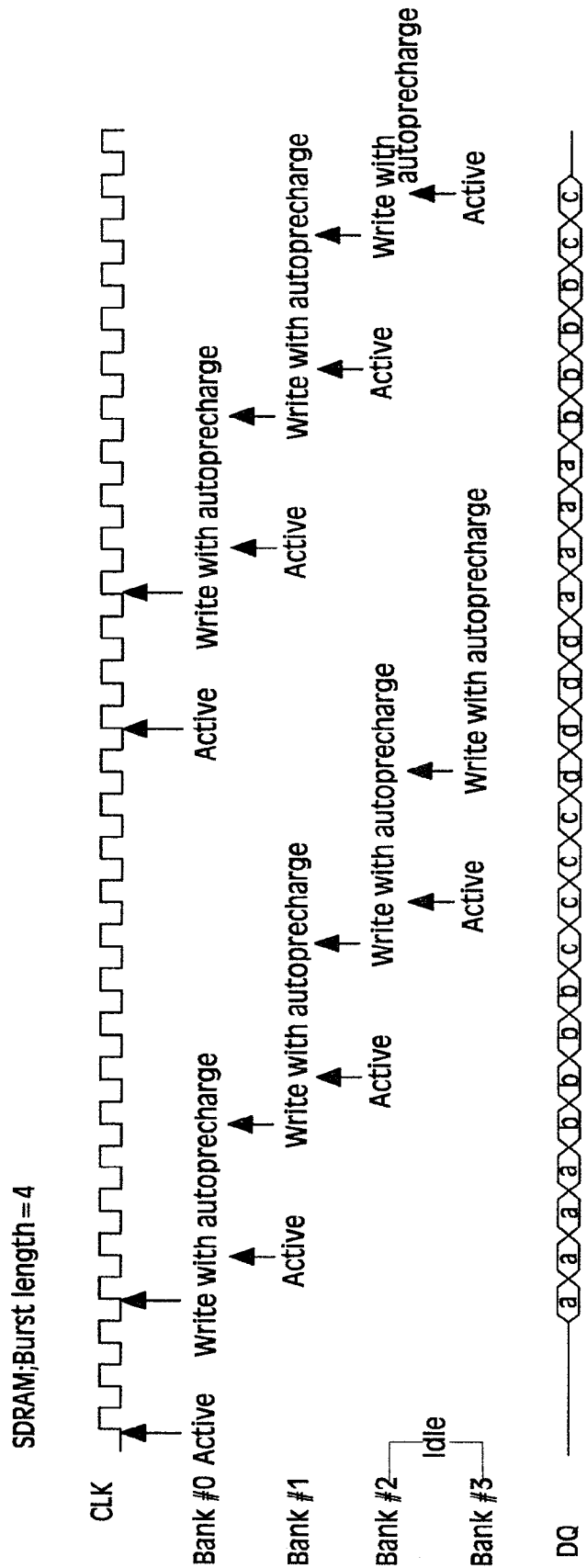
FIG. 12 is a clocked timing diagram using still another conventional memory testing method.

With reference to FIG. 7, the x-coordinate of the test results for memory tests utilizing continuous, varying data represents the data variation ratio of input data, and the y-coordinate represents the detection rate for weakened memory. As seen in the graph of the test results, the detection rate is considerably influenced by the 75% critical value of data variation ratio. When the data variation ratio rises above 75%, the detection rate for weakened memory increases dramatically. Therefore, the objective of memory testing in the present invention is fully accomplished.

The foregoing illustration of the preferred embodiments in the present invention is intended to be illustrative only, under no circumstances should the scope of the present invention be so restricted. The memory testing method under the present invention has made considerable improvements in terms of productivity and efficiency.

What is claimed is:

1. A method of testing memory with continuous, varying data, comprising the step of continuously inputting a test data with a plurality of binary data strings respectively to a plurality of I/O pins of a tested memory, wherein at least a 75% of the number of the data strings are varying in binary content with respect to a clock.

2. The method of testing memory with continuous, varying data as claimed in claim 1, wherein a change in die test data is determined by the switching of electric potential on the input of data I/O pins between high and low levels.

3. The method of testing memory with continuous, varying data as claimed in claim 2, wherein a data I/O operation uses at least 75% of the output pins on a tested memory, in accordance with the 75% data variation ratio requirement.

4. The method of testing memory with continuous, varying data as claimed in claim 2, wherein the data I/O operation uses at least 75% of the total memory cells on a tested memory, in accordance with the 75% data variation ratio requirement.

5. The method of testing memory with continuous, varying data as claimed in claim 2, wherein the data I/O operation uses at least 75% of all memory pages on a tested memory, in accordance with the 75% data variation ratio requirement.

6. The method of testing memory with continuous, varying data as claimed in claim 1, wherein continuous I/O is conducted through the input pins of a tested memory.

7. The method of testing memory with continuous, varying data as claimed in claim 6, wherein the data I/O operation uses at least 75% of the total output pins on the tested memory, in accordance with the 75% data variation ratio requirement.

8. The method of testing memory with continuous, varying data as claimed in claim 6, wherein the data I/O operation uses at least 75% of the total memory cells on the tested memory, in accordance with the 75% data variation ratio requirement.

9. The method of testing memory with continuous, varying data as claimed in claim 6, wherein the data I/O operation uses at least 75% of all memory pages on the tested memory, in accordance with the 75% data variation ratio requirement.

10. The method of testing memory with continuous, varying data as claimed in claim 1, wherein continuous I/O is conducted through the output pins of a tested memory.

11. The method of testing memory with continuous, varying data as claimed in claim 10, wherein the data I/O operation uses at least 75% of the total output pins on the tested memory, in accordance with the 75% data variation ratio requirement.

12. The method of testing memory with continuous, varying data as claimed in claim 10, wherein the data I/O operation uses at least 75% of the total memory cells on the tested memory, in accordance with the 75% data variation ratio requirement.

13. The method of testing memory with continuous, varying data as claimed in claim 10, wherein the data I/O operation uses at least 75% of all memory pages on the tested memory, in accordance with the 75% data variation ratio requirement.

14. The method of testing memory with continuous, varying data as claimed in claim 1, wherein continuous I/O is conducted through the input and output pins of a tested memory.

15. The method of testing memory with continuous, varying data as claimed in claim 14, wherein the data I/O operation uses at least 75% of the total output pins on the tested memory, in accordance with the 75% data variation ratio requirement.

16. The method of testing memory with continuous, varying data as claimed in claim 14, wherein the data I/O operation uses at least 75% of the total memory cells on the tested memory, in accordance with the 75% data variation ratio requirement.

17. The method of testing memory with continuous, varying data as claimed in claim 14, wherein the data I/O operation uses at least 75% of all memory pages on the tested memory, in accordance with the 75% data variation ratio requirement.

18. The method of testing memory with continuous, varying data as claimed in claim 1, wherein the tested memory chip can be SDRAM, DDR-DRAM, RDRAM, SRAM, FCRAM or flash memory.

19. The method of testing memory with continuous, varying data as claimed in claim 1, wherein at least one of the binary data strings is not changed with the clock.

20. The method of testing memory with continuous, varying data as claimed in claim 1, wherein the number of the binary data strings is four, and one of the four binary strings is not changed with the clock.

* * * * *